Figure 1:
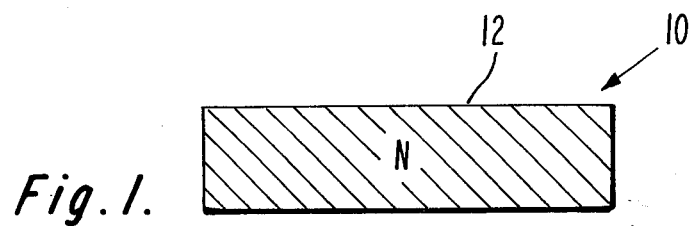

United States Patent [19]

Rosnowski et al.

[11] 4,050,967
[45] Sept. 27, 1977

[54] METHOD OF SELECTIVE ALUMINUM DIFFUSION

[75] Inventors: Wojciech Rosnowski, Summit; Samuel Ponczak, Somerville, both of N.J.

[73] Assignee: RCA Corporation, New York, N.Y.

[21] Appl. No.: 749,179

[22] Filed: Dec. 9, 1976

[51] Int. Cl.² .................. H01L 21/223; H01L 21/225
[52] U.S. Cl. .................................. 148/189; 148/187; 148/188
[58] Field of Search ................. 148/189, 188, 187

[56] References Cited

U.S. PATENT DOCUMENTS

| | | |
|---|---|---|
| 3,502,517 | 3/1970 | Sussmann .................... 148/188 X |
| 3,615,936 | 10/1971 | Batz ............................ 148/187 |
| 3,764,413 | 10/1973 | Kakizaki et al. ............. 148/188 |
| 3,909,926 | 10/1975 | Hutson ..................... 148/188 X |
| 3,928,095 | 12/1975 | Harigaya et al. ........... 148/188 |
| 3,980,507 | 9/1976 | Carley ......................... 148/187 |
| 3,997,379 | 12/1976 | Rosnowski .................. 148/189 |

*Primary Examiner*—G. Ozaki
*Attorney, Agent, or Firm*—H. Christoffersen; R. P. Williams; R. A. Hays

[57] ABSTRACT

A silicon substrate is coated with a mask comprised of the combination of a silicon dioxide layer and a layer of undoped polycrystalline silicon. Aluminum is then diffused through windows formed in the mask. The mask has proven effective for relatively deep aluminum diffusion.

10 Claims, 8 Drawing Figures

METHOD OF SELECTIVE ALUMINUM DIFFUSION

This invention generally relates to a novel method of selectively diffusing an aluminum dopant into a substrate of semiconductive material. It pertains to the discovery of a new and more effective mask against aluminum diffusion than those previously known.

In the manufacture of planar semiconductor devices, it frequently becomes necessary to diffuse a P-type dopant into an N-type or P-type substrate. The most common P-type dopant is boron and the most common substrate is silicon. The boron is selectively diffused into various regions of the substrate by first forming a silicon dioxide masd in those areas which are not to be doped, by then placing the masked substrate in a source of boron and finally by heating the substrate to diffuse the boron through openings in the mask and into the substrate. However, with the emergence of high voltage devices such as planar thyristors, it has become necessary to diffuse P-type impurities to greater depths than those heretofore required and efforts have been made to substitute aluminum for boron as a P-type diffusant because its faster diffusion rate allows for a reduced time of high temperature heat treatment. Further, aluminum has a better lattice match to silicon than does boron, resulting in superior devices. However, it has been observed that the used of silicon dioxide as a mask against aluminum results in mask failure for relatively deep diffusions. See P. Rai-Choudbury et al., 21 *Journal of Electrochemical Society,* 2 page 1509, November, 1974. The reason $SiO_2$ is such a poor mask for deep aluminum diffusions is thought to be that the aluminum, unlike boron, reacts with the $SiO_2$ masking layer and forms aluminum oxide by the thermodynamically favored reaction:

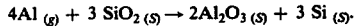

$$4Al_{(g)} + 3 SiO_{2(S)} \rightarrow 2Al_2O_{3(S)} + 3 Si_{(S)}.$$

As the diffusion continues, the $SiO_2$ layer is consumed by this reaction and aluminum oxide is produced in its place. When the $SiO_2$ layer has been completely eliminated, the aluminum oxide rests directly on the silicon surface and acts as a source of aluminum dopant thus introducing dopant into undesired areas. One method of avoiding this kind of mask failure is disclosed in the copending application of W. Rosnowski, Ser. No. 718,806, which is assigned to RCA Corporation now U.S. Pat. No. 4,029,528. There it is disclosed that it is possible to avoid mask failure caused by aluminum diffusants by choosing the thickness of the $SiO_2$ masking layer such that is will not be completely consumed by the reaction of the dopant with the mask. However, there is a practical limit to the thickness which is obtainable in the production of $SiO_2$ layers. Since $SiO_2$ has a different thermal expansion coefficient than silicon, extremely thick oxides may produce mechanical stress on silicon wafers. Further, thick oxide films require long periods to deposit and to remove. If etching is required to remove them some standard photoresists may fail, due to the length of time they are subjected to the etchant. The present method provides an alternative to the thick oxide mask against aluminum diffusants.

Because of the drawbacks of $SiO_2$ masks against certain diffusants, other have proposed the use of both silicon nitride masks and combination silicon dioxide-silicon nitride masks. See British Pat. No. 1,252,281 and U.S. Pat. No. 3,664,896. However, for deep diffusions, i.e., those occurring at relatively high temperatures and for relatively long processing times, it becomes increasingly difficult to remove the nitride masking layer after the diffusion is complete.

Figure 6:
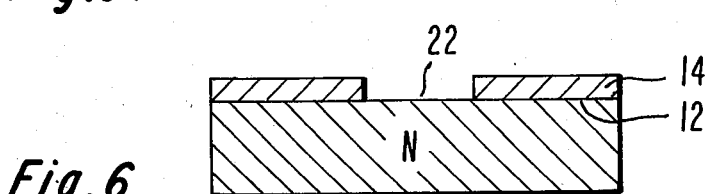
Figure 7:
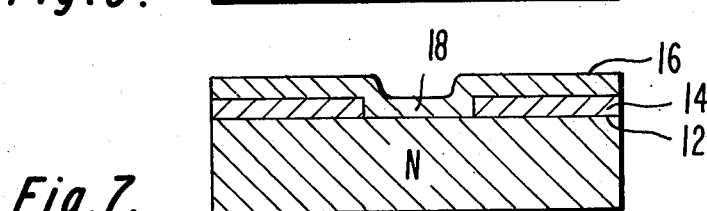
Figure 8:
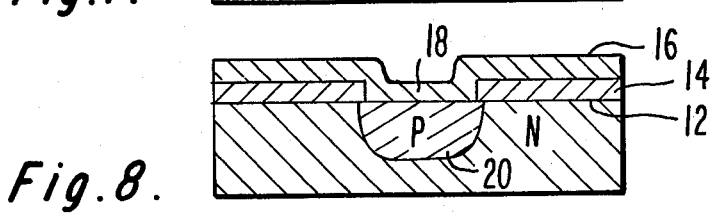

In the drawings:

FIGS. 1–5 are a series of cross-sectional views representing a series of processing steps illustrative of a first embodiment of the present method, and FIGS. 6–8 are similar cross-sections representing a series of processing steps illustrative of a second embodiment of the instant method.

FIG. 1 shows a silicon body 10 having a major surface 12. The silicon body 10 is a part of a larger silicon wafer (not shown). Although shown an described as having an N-type conductivity, the conductivity type of the body 10 is immaterial to the practice of the present invention.

Figure 2:
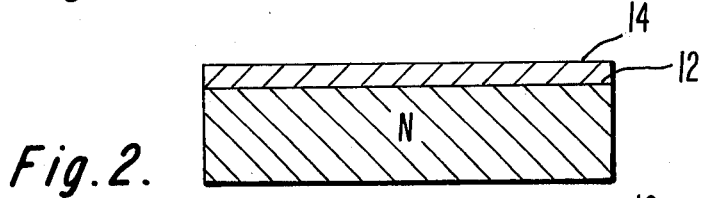

As illustrated in FIG. 2, a layer 14 of silicon dioxide is formed on the surface 12 of the body 10. The silicon dioxide layer 14 is preferably formed so as to have a thickness of about 20,000A. The layer 14 may be either thermally grown or pyrolytically formed; however, we prefer thermal growth because the layer is considerably denser than one which is pyrolytically formed and, thus, no annealing is required. A 20,000A layer of silicon dioxide may be thermally grown, for example, by exposing the body 10 to an atmosphere of steam at a temperature of 1000° C for a period of about 16 hours. The oxidized body 10 is then slowly cooled, i.e. cooled at a rate on the order of about 2° C per minute to a temperature of about 870° C and then slowly removed from the oven, i.e. withdrawn over a period of about 5 minutes. In this way the silicon dioxide layer 14 has been found to be substantially free of cracks and other damage.

Figure 3:
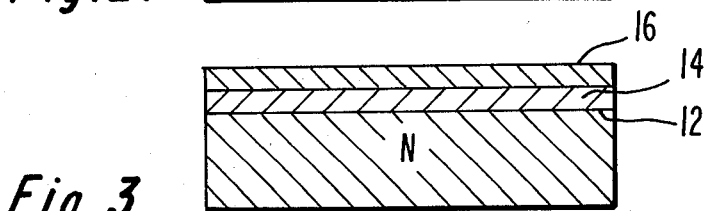
Figure 4:
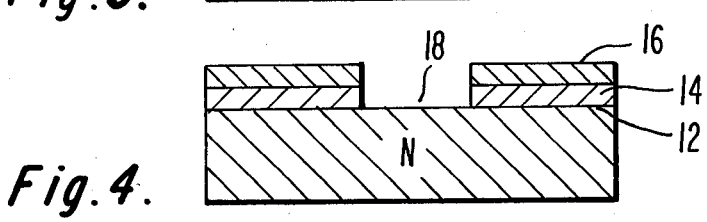
Figure 5:
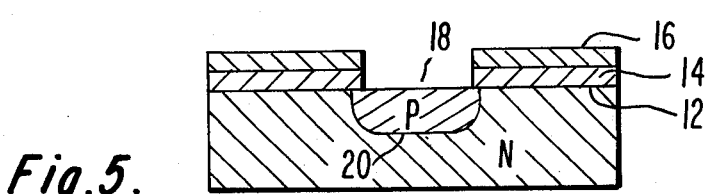

As illustrated in FIG. 3, a layer 16 of substantially undoped polycrystalline silicon, also preferably about 20,000A thick, is formed on the silicon dioxide layer 14 by conventional methods. A polycrystalline layer 16 to which no dopants have been added typically has a resistivity no less than about $10^3$ ohm-cm. Preferably, the polycrystalline layer 16 is formed by placing the body 10 in a chamber and heating it to a temperature of about 610° C in the presence of a mixture containing 6% silane, $SiH_4$, and 94% $H_2$ as a carrier gas. The deposition rate for this reaction is about 300A per minute. The combination of the silicon dioxide layer 14 and the polycrystalline layer 16 comprise the masking layer of the present invention. Then, as shown in FIG. 4, the masking layer, i.e. both the polycrystalline silicon layer 16 and the silicon dioxide layer 14 are etched, by conventional methods, to form an opening 18 to the underlying silicon body 10 in the area in which an eventual diffused region is to be formed. Thus a masked portion and an unmasked portion are defined on the surface 12.

Finally, the entire wafer, of which the body 10 is a part, is subjected to a source of dopant. The body 10 is preferably placed in a vacuum chamber, not shown, in which an aluminum vapor may be created. The aluminum vapor may be formed, for example, by heating, in a vacuum, an aluminum-silicon alloy, comprising 37% aluminum and 63% silicon, to a temperature of between 1000° C and 1200° C, however, we prefer a diffusion temperature of 1150° C. The wafer is inserted into the chamber and held at the diffusion temperature for about two hours, at which time it has been determined that a pocket 20 (FIG. 5) having a diffusion depth of about 15

μm. will have been formed. While the diffusion depth and the surface impurity concentration of pocket 20 are dependent upon design considerations, we prefer a surface concentration of about $5 \times 10^{18}$ atoms/cm$^3$ when producing deep diffusion regions of high voltage thyristors.

An aluminum impurity source may also be provided by first depositing a layer of aluminum onto the surface of the polycrystalline silicon layer 16 and also onto the surface of the body 10 in the region of the opening 18 and then diffusing from the aluminum layer rather than diffusing directly from a vapor. However, whichever diffusion method is chosen, the wafer will be subjected to an additional heating, or drive-in step by subjecting it to a temperature of 1300° C for a period of at least 20 hours in order to form P-type regions having the appropriate profile and depth.

Referring now to FIG. 6, a second embodiment of the present method is disclosed. There, a silicon body 10, similar to that depicted in FIG. 2, is shown except that an opening 22 is formed through the silicon dioxide layer 14 extending to the silicon body below prior to deposition of the polycrystalline layer.

Next, as shown in FIG. 7, an undoped polycrystalline layer 16, which may be formed by the same process as that described above, is deposited not only on the silicon dioxide layer 14, but also extending through the opening 18 and contacting the silicon body 10.

Finally, as shown in FIG. 7, the wafer of which body 10 is a part is subjected to a source of aluminum impurities, for example, a vaporized source of aluminum in a vacuum system. The substrate is heated to a temperature of 1150° C for a period of about 2 hours, which causes the diffusion of aluminum through the polycrystalline layer 16 in the opening 18, thus forming the P-type pocket 20 in the substrate 10. Since aluminum diffuses much more rapidly through the polycrystalline silicon layer 16 than through the combined polycrystalline and silicon dioxide layers, it is not necessary to expose the underlying silicon body to the ambient.

A third embodiment of the present method (not illustrated) is similar to the first two already disclosed, but somewhat less effective. According to this embodiment, a silicon body is prepared similar to that illustrated in FIG. 3, i.e., a silicon body 10 upon which a masking layer comprised of layers of silicon dioxide 14 and undoped polycrystalline silicon 16 have been formed. However, next, unlike the device shown in FIG. 4, an opening 18 is formed in the polycrystalline layer 16 which does not extend through the silicon dioxide layer 12. Finally, aluminum impurities are diffused, using one of the methods set forth above, through both the opening in the polycrystalline layer and that portion of the silicon dioxide layer which is situated beneath the opening. Because the combination of a silicon dioxide layer and a polycrystalline silicon layer is such an effective aluminum mask when compared to either layer acting singly, it is possible to diffuse through the silicon dioxide without losing mask effectiveness.

The foregoing embodiments provide a mask for aluminum diffusants which is much superior to that previously known. For example, a mask comprised solely of a 20,000A of SiO$_2$ when subjected to aluminum diffusants at 1150° C in a vacuum fails in approximately seven minutes. Further, a 20,000A layer of polycrystalline silicon acting as an aluminum mask in a vacuum at 1150° C fails in about two minutes. However, a combination SiO$_2$-polycrystalline mask used in accordance with the teachings of the present invention has withstood aluminum diffusion at 1150° C for more than 7½ hours.

What is claimed is:

1. A method of selectively diffusing aluminum into a wafer including a silicon body having a surface comprising:
    forming a masking layer comprising a layer of silicon dioxide and a layer of polycrystalline silicon on a surface of said body;
    forming an opening in at least one of said layers thereby defining a masked portion and an unmasked portion of said surface;
    subjecting said wafer, including both the unmasked portion of said surface and said masked portion to a source of aluminum impurities; and
    diffusing said aluminum through said opening and into said body.

2. The method of claim 1, wherein said impurity source is an aluminum vapor.

3. The method of claim 2, wherein said diffusion is accomplished by:
    forming said aluminum vapor in a vacuum chamber;
    placing said body into said chamber; and
    heating said body to diffuse said aluminum through said opening.

4. The method of claim 1, wherein said impurity source is an aluminum layer which is formed on said undoped polycrystalline layer, and which extends through said opening.

5. The method of claim 1, wherein said layer of polycrystalline silicon is substantially undoped.

6. The method of claim 5, wherein said layer of polycrystalline silicon has a resistivity no less than 10$^3$ ohm-cm.

7. The method of claim 1, wherein said wafer is heated to a temperature of between 1000° C and 1200° C for a period of at least 2 hours.

8. The method of claim 1 wherein said opening is formed to said body through said layer of silicon dioxide and also through said layer of polycrystalline silicon.

9. The method of claim 1, wherein said opening is formed in said layer of silicon dioxide and wherein said layer of polycrystalline silicon extends through said opening to said substrate.

10. The method of claim 1, wherein said opening is formed in said layer of polycrystalline silicon and wherein said opening does not extend through said layer of silicon dioxide.

* * * * *